United States Patent
Nene et al.

(10) Patent No.: US 9,831,863 B2
(45) Date of Patent: *Nov. 28, 2017

(54) DIGITAL CURRENT SENSING IN POWER CONTROLLER

(71) Applicant: Intel Corporation, Santa Clara, CA (US)

(72) Inventors: Santosh Nene, Bangalore (IN); Tarun Mahajan, Bangalore (IN); Venkataraman Srinivasan, Bangalore (IN); Ramnarayanan Muthukaruppan, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/350,404

(22) Filed: Nov. 14, 2016

(65) Prior Publication Data

US 2017/0063360 A1 Mar. 2, 2017

Related U.S. Application Data

(63) Continuation of application No. 14/560,073, filed on Dec. 4, 2014, now Pat. No. 9,496,852.

(51) Int. Cl.
*H02M 3/158* (2006.01)
*H03K 5/156* (2006.01)
(Continued)

(52) U.S. Cl.
CPC ........... *H03K 5/1565* (2013.01); *G01R 19/25* (2013.01); *G01R 19/2506* (2013.01);
(Continued)

(58) Field of Classification Search
CPC ....... H03K 3/017; G01R 19/25; H02M 3/156; H02M 3/158
See application file for complete search history.

(56) References Cited

U.S. PATENT DOCUMENTS 6,519,707 B2 2/2003 Clark et al.
8,049,473 B2 * 11/2011 Hu ........................ H02M 3/156
323/271

(Continued)

FOREIGN PATENT DOCUMENTS

CN 105680689 A 6/2016
JP 2005304218 A 10/2005
(Continued)

OTHER PUBLICATIONS

"U.S. Appl. No. 14/560,073, Notice of Allowance dated Jul. 14, 2016", 9 pgs.

(Continued)

*Primary Examiner* — Patrick O'Neill
(74) *Attorney, Agent, or Firm* — Schwegman Lundberg & Woessner, P.A.

(57) ABSTRACT

Some embodiments include apparatus and methods having a node to provide a signal, and a control unit arranged to control a value of an output voltage at an output node on an output path based on a duty cycle of the signal and a value of an input voltage. The control unit can also be arranged to cause a change in a resistance on the output path in order to determine a value of a current on the output path based at least on the change in the resistance.

20 Claims, 6 Drawing Sheets

(51) Int. Cl.
    *G01R 19/25*     (2006.01)
    *H03K 3/017*     (2006.01)
    *H02M 1/088*     (2006.01)
    *H02M 1/00*     (2006.01)

(52) U.S. Cl.
    CPC ............ *H02M 3/158* (2013.01); *H03K 3/017* (2013.01); *H02M 1/088* (2013.01); *H02M 2001/0009* (2013.01); *H02M 2001/0022* (2013.01)

(56) References Cited

U.S. PATENT DOCUMENTS

| | | | |
|---|---|---|---|
| 8,278,901 B2* | 10/2012 | Noda | H02M 3/1588 323/284 |
| 8,928,305 B2* | 1/2015 | Ueunten | H02M 3/158 323/313 |
| 9,496,852 B2* | 11/2016 | Nene | H02M 3/158 |
| 2007/0241732 A1 | 10/2007 | Luo et al. | |
| 2008/0012542 A1* | 1/2008 | Liu | H02M 1/32 323/271 |
| 2009/0153110 A1 | 6/2009 | Huang | |
| 2012/0293155 A1 | 11/2012 | Chan et al. | |
| 2014/0266110 A1* | 9/2014 | Yuan | H02M 3/156 323/282 |
| 2014/0347078 A1* | 11/2014 | Qin | G01R 19/0092 324/713 |
| 2015/0200593 A1* | 7/2015 | Stoichita | H02M 3/158 323/271 |
| 2015/0364995 A1* | 12/2015 | Chen | H02M 3/158 323/271 |
| 2016/0164500 A1 | 6/2016 | Nene et al. | |

FOREIGN PATENT DOCUMENTS

| | | |
|---|---|---|
| KR | 20160067727 A | 6/2016 |
| TW | I411206 B | 10/2013 |
| TW | 201629686 A | 8/2016 |
| WO | WO-2016089556 A1 | 6/2016 |

OTHER PUBLICATIONS

"International Application Serial No. PCT/US2015/059897, International Search Report dated Feb. 24, 2016", 3 pgs.

"International Application Serial No. PCT/US2015/059897, Written Opinion dated Feb. 24, 2016", 8 pgs.

"Korean Application Serial No. 10-2015-0151914, Office Action dated Feb. 28, 2017", w/ English Summary and Claims, 11 pgs.

"Taiwanese Application Serial No. 104135846, Office Action dated Sep. 14, 2016", w/ English Translation, 7 pgs.

"Taiwanese Application Serial No. 104135846, Response filed Dec. 9, 2016 to Office Action dated Sep. 14, 2016", w/ Claims in English, 49 pgs.

\* cited by examiner

201

DIGITAL CURRENT SENSING IN POWER CONTROLLER

CROSS-REFERENCE TO RELATED APPLICATION

This application is a continuation of U.S. patent application Ser. No. 14/560,073, filed Dec. 4, 2014, which is incorporated by reference herein in its entirety.

TECHNICAL FIELD

Embodiments described herein pertain to power management in electronic items. Some embodiments relate to voltage controllers.

BACKGROUND

Many electronic devices or systems, such as computers, tablets, and cellular phones, have a power controller (e.g., a power management unit) to control power (e.g., current and voltage) in the device or system. Some conventional power controllers have techniques to monitor the value of current, voltage, or both in order to maintain proper power management operations. Some conventional techniques, however, may suffer from one or more of the following: higher cost for the power controller, larger power controller size, and inefficient power management.

DETAILED DESCRIPTION

Figure 1:
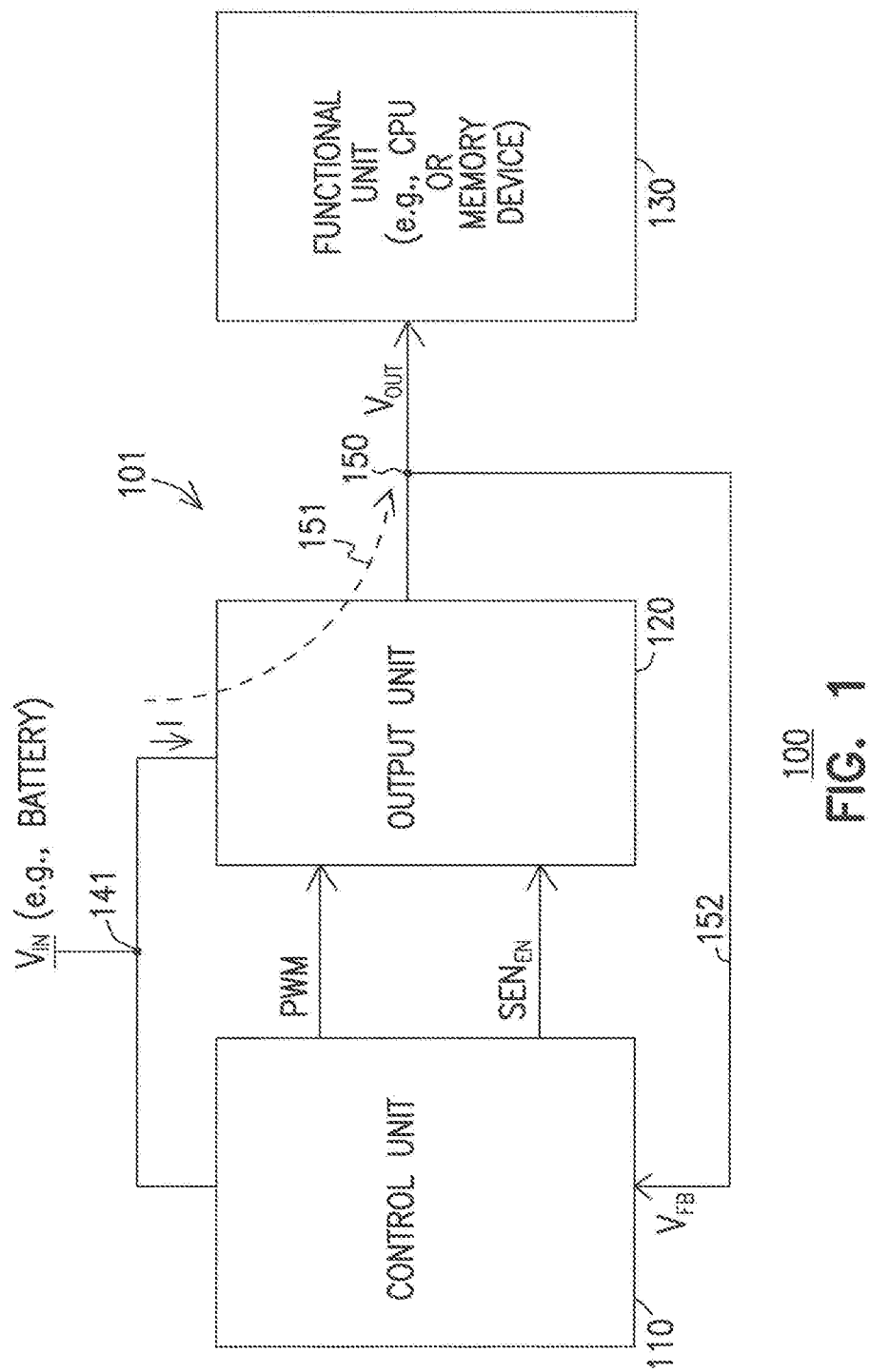
FIG. 1 shows an apparatus including a power controller, according to some embodiments described herein.

FIG. 1 shows an apparatus 100 including a power controller 101, according to some embodiments described herein. Apparatus 100 can include or be included in an electronic device or system, such as a computer (e.g., desktop, laptop, or notebook), a tablet, a cellular phone, or other electronic devices or systems. Power controller 101 can be arranged to manage power (e.g., supply voltages) provided to other components, such as a functional unit 130, of apparatus 100. Examples of functional unit 130 include a processor, such as a central processing unit (CPU), a memory device, a system on chip (SoC), and other electronic components of apparatus 100.

As shown in FIG. 1, power controller 101 can include a control unit 110 and an output unit 120. Output unit 120 can be arranged to provide an output voltage $V_{OUT}$ at an output node 150 on an output path 151. Output path 151 can include a conductive path between anode (e.g., input node) 141 and output node 150. Node 141 can be arranged to receive a voltage (e.g., input voltage) $V_{IN}$, which can be a supply voltage provided by a power source, such as a battery.

Control unit 110 can be arranged to control the value of output voltage $V_{OUT}$. For example, control unit 110 can generate a signal PWM (e.g., a pulse width modulation signal). Control unit 110 can control a duty cycle D of signal PWM, such that the value of voltage $V_{OUT}$ can be based on (e.g., proportional to) the value of the duty cycle D and the value of voltage $V_{IN}$ (e.g., $V_{OUT}=D*V_{IN}$). The duty cycle D of signal PWM is less than 100%, such that the value of duty cycle D is less than one. Thus, the value of voltage $V_{OUT}$ is less than the value of voltage $V_{IN}$ (e.g., for buck voltage regulator configuration).

Control unit 110 can also generate a signal $SEN_{EN}$, which can be part of a command sent from control unit 110 to output unit 120 when control unit 110 wishes to perform a current calculation operation (e.g., current sensing operation) to determine a value of a current I (e.g., load current) on output path 151. Control unit 110 may periodically (e.g., at every fixed time interval) or non-periodically (e.g., at variable time intervals) perform the current calculation operation. The value of current I calculated from the current calculation operation can be part of telemetry information collected by power controller 101 for use in other power management operations of power controller 101. Examples of such operations include fine tuning some voltage rails, such as Voltage Identification Digital (VID) levels in apparatus 100, switching modes of operation of power controller 101 (e.g., from PWM mode to another mode, such as a low-power pulse-frequency modulation (PFM)/hysteretic mode), or other operations based on the telemetry information. These operations may allow power controller 101 to improve power management in apparatus 100, such as to improve (e.g., extend) the life of a battery that provides power (e.g., voltage $V_{IN}$) to apparatus 100.

As shown in FIG. 1, power controller 101 can include a feedback path 152 coupled to output node 150 to provide a voltage (e.g., feedback voltage) $V_{FB}$ based on (e.g., proportional to) the value of voltage $V_{OUT}$. During some operations of apparatus 100, the value of voltage $V_{OUT}$ (or $V_{IN}$ or both) may change due to variations in operating conditions (e.g., changes in voltage $V_{IN}$, operating temperature, or both). Control unit 110 can be arranged to receive voltage $V_{FB}$ and adjust (e.g., automatically adjust) the duty cycle D of signal PWM based on the value of voltage $V_{FB}$ with respect to set reference voltage $V_{REF}$. This allows control unit 110 to maintain the relationship between voltages $V_{OUT}$ and $V_{IN}$ (e.g., $V_{OUT}=D*V_{IN}$) in order to keep the value of voltage $V_{OUT}$ at a relatively constant value decided by voltage $V_{REF}$ in different operating conditions of apparatus 100.

For purposes of the current calculation operation performed by power controller 101, control unit 110 may cause (e.g., intentionally cause) the resistance on output path 151 to change (e.g., temporarily change) from one known resistance value to another known resistance value. This causes a change (e.g., a decrease) in the value of voltage $V_{OUT}$. In order to compensate for the change in the value of voltage $V_{OUT}$, control unit 110 adjusts the duty cycle D of signal PWM (e.g., causes a change in the duty cycle from one known duty cycle D to another known duty cycle). Based on the change in the resistance value and the change in the duty cycle of signal PWM, and the relationship between $V_{IN}$ and $V_{OUT}$ on output path 151 ($V_{OUT}=D*V_{IN}-I*R_{EFF}$, where $R_{EFF}$ is the total effective resistance of the power train between input and output), control unit 110 can determine (e.g., calculate) the value of current I on output path 151.

As mentioned above, control unit 110 may cause a temporary change in the resistance on output path 151 for purposes of calculating the value of current I. Thus, after control unit 110 obtains enough information for the current calculation, control unit 110 can revert the change in the resistance on output path 151 in order to return power controller 101 to its normal operation. Control unit 110 may periodically (or non-periodically) repeat the temporary change in the resistance on output path 151 whenever it performs a current calculation.

Power controller 101 can include structures and operations of a power controller described in more detail below with reference to FIG. 2 through FIG. 6.

Figure 2:
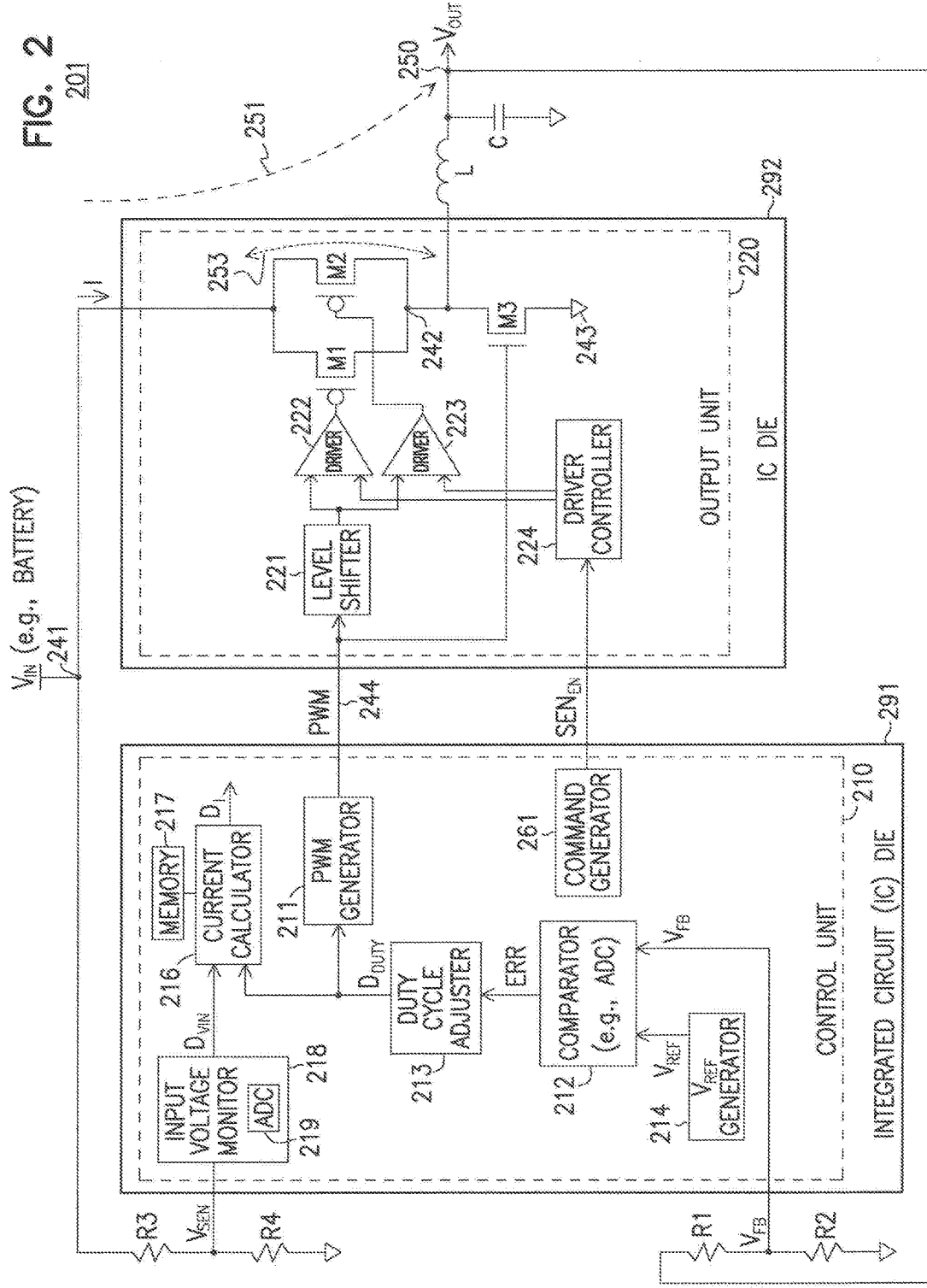
FIG. 2 shows a circuit diagram of a power controller, according to some embodiments described herein.

FIG. 2 shows a circuit diagram of a power controller 201, according to some embodiments described herein. Power controller 201 can correspond to power controller 101 of FIG. 1 and operate in ways similar to that of power controller 101. For example, power controller 201 can include an output unit 220 to provide voltage $V_{OUT}$ at an output node 250 based on voltage $V_{IN}$ at a node 241 and a set reference voltage $V_{REF}$. Power controller 201 can also include a control unit 210 to generate signal PWM (at a node 244) and set the duty cycle (e.g., duty cycle D) of signal PWM, such that the relationship between voltage $V_{OUT}$ at output node 250 and voltage $V_{IN}$ at node 241 can be $V_{OUT}=D*V_{IN}$ under ideal conditions. In reality, the duty cycle of signal PWM may be greater than ideal duty cycle D based on the load current and $V_{OUT}=D*Vin-I*R_{EFF}$. Control unit 210 can also generate a signal (e.g., enable signal) $SEN_{EN}$ that can be part of a command sent from control unit 210 to output unit 220 when control unit 210 wishes to perform a current calculation in order to determine the value of current on an output path 251.

Output unit 220 can include transistors M1 and M2 (e.g., "high-side" transistors) coupled in parallel between nodes 241 and 242, and a transistor M3 (e.g., a "low-side" transistor) coupled between node 242 and a node 243. Node 243 can receive ground potential. As shown in FIG. 2, output path 251 can include a conductive path between node 241 and output node 250, such that a conductive path 253 between nodes 241 and 242 and a conductive path through inductor L are part of output path 251 when the transistors M1 and M2 are turned on. Conductive path 253 can include conductive paths through transistors M1 and M2. Another conductive path between nodes 243 and 250 can also be formed when transistor M3 is turned on. During operation of power controller 201, either a high-side conductive path is ON (e.g., a conductive path between nodes 241 and 242 is formed) or a low-side conductive path is ON (e.g., a conductive path between nodes 243 and 250 is formed).

Each of transistors M1 and M2 can include a field effect transistor (FET), such as a p-channel metal-oxide semiconductor (PMOS) transistor. Transistor M2 can include an n-channel metal-oxide semiconductor (NMOS) transistor. During operations of power controller 201, the resistance on conductive path 253 between nodes 241 and 242 can include a parallel combination of the resistance of transistor M1 (e.g., on-state resistance between the source and drain of transistor M1) and the resistance of transistor M2 (e.g., on-state resistance between the source and drain of transistor M2).

in a current calculation operation, control unit 210 can operate to cause the resistance on conductive path 253 between nodes 241 and 242 to change (e.g., temporarily change) by a known change value (described in more detail below). Then, control unit 210 can determine the value of current I based on the change in the resistance and other information obtained from operations of control unit 210 in responses to the change in the resistance. For example, by changing the resistance on conductive path 253 between nodes 241 and 242, the effective voltage drop across nodes 241 and 242 when the high-side conductive path is ON is changed by an IR drop (a voltage amount) corresponding to current on output path 251 and the change in the resistance. Since conductive path 253 between nodes 241 and 242 is part of output path 251, a change in the resistance on conductive path 253 also causes a change in the resistance on output path 251. Thus, the increased IR drop across nodes 241 and 242 when the high-side conductive path is ON can cause the value of voltage $V_{OUT}$ on output path 251 to change. In response to the change in the value of voltage $V_{OUT}$, control unit 210 adjusts (e.g., automatically adjusts) the duty cycle of signal PWM in order to keep the value of voltage $V_{OUT}$ at a relatively constant value (e.g., a predetermined value). Based on the known change in the resistance, the change in the duty cycle, and the relationship $V_{OUT}=D*V_{IN}-I*R_{EFF}$, control unit 210 can determine the value of the current that caused the IR drop, which is also current on output path 251.

Control unit 110 may perform the following activities in order to cause output unit 220 to change the resistance on conductive path 253 between nodes 241 and 242. For example, during a normal operation (which is before the current calculation) of power controller 201, both transistor M1 and transistor M2 are turned on. When control unit 210 wishes to calculate the value of current on output path 251, it may activate signal $SEN_{EN}$ (e.g., causing signal $SEN_{EN}$ to switch from an initial level to another level) In response to signal $SEN_{EN}$ being activated, output unit 220 can turn off one of transistors M1 and M2, such as transistor M1 in this example. Transistor M1 may be turned off for a time interval (e.g., for multiple consecutive cycles of signal PWM) sufficient to allow control unit 210 to obtain information for the current calculation. Transistor M1 can be turned on again after control unit 210 obtains enough information for the current calculation, in order to return power controller 201 to its normal operation.

The following description shows a simplified analysis for determining the value of current I by control unit 210.

The ideal relationship between voltages $V_{OUT}$ and $V_{IN}$ can be expressed by equation (1), where D is the duty cycle of signal PWM.

$$V_{OUT}=D*V_{IN} \qquad (1)$$

When the resistance on conductive path 253 between nodes 241 and 242 is changed (e.g., when transistor M1 is turned off), the resistance on conductive path 253 between nodes 241 and 242 can increase by ΔR, where ΔR=R"-R', in which R' represents the resistance (e.g., "high-side" resistance) on conductive path 253 between nodes 241 and 242 before the change in the resistance (e.g., before transistor M1 is turned off), and R" represents the resistance (e.g., "high-side" resistance) on conductive path 253 between nodes 241 and 242 after the change in the resistance (e.g., after transistor M1 is turned off). Since the resistance on conductive path 253 between nodes 241 and 242 is changed by ΔR, the effective voltage drop between nodes 241 and 242 is also changed (e.g., increased) by I*ΔR (e.g., IR drop) during the high-side turn-on time, where I represents current I on output path 251.

When the voltage drop between nodes 241 and 242 is changed (e.g., increased by I*ΔR), control unit 210 increases the duty cycle of signal PWM in order keep the value of voltage $V_{OUT}$ after the change in the resistance the same as the value of voltage $V_{OUT}$ before the change in the resistance. Thus, the value of voltage $V_{OUT}$ after the change in the resistance can be expressed by equation (2).

$$V_{OUT}=(D1+\Delta D)*(V_{IN}-I*\Delta R) \quad (2)$$

In equation (2), D1 represents the value of the duty cycle of signal PWM before the change in the resistance, and $\Delta D=D2-D1$, where D2 represents the value of the duty cycle of signal PWM after control unit 210 adjusts the duty cycle of signal PWM.

Equating the right-hand sides of equations (1) provides equation (3) as follows.

$$D1*V_{IN}=(D1+\Delta D)*(V_{IN}-I*\Delta R) \quad (3)$$

By simplifying equation (3) and ignoring the $\Delta R*\Delta D$ product term because it can be extremely small, equation (3) becomes equation (4).

$$D*I*\Delta R=\Delta D*V_{IN} \quad (4)$$

Thus, $$I=V_{IN}*(\Delta D/D1)/\Delta R \quad (5)$$

Based on equation (5), control unit 210 can be arranged to calculate the value of I, which is current I on output path 251.

The following description shows a detailed analysis for determining the value of current I by control unit 210.

The relationship between voltages $V_{OUT}$ and $V_{IN}$ can be expressed by equations (6) and (7), where R' and R" represent the resistance on conductive path 253 before and after the change in the resistance on conductive path 253, $R_{LS}$ represents the resistance e.g., "low-side" resistance) on a conductive path between nodes 242 and 243, and $R_{IND}$ represents the resistance of inductor L.

$$V_{OUT}=D*(V_{IN}-I*R')-(1D))*I*R_{LS}-(I*R_{IND}) \quad (6)$$

When R' changes to R", the duty cycle of signal PWM is adjusted from D1 to D1+$\Delta$D, such that the value of voltage $V_{OUT}$ before and after the change in the resistance remains at a relatively constant value. Thus, the value of voltage $V_{OUT}$ after the change in the resistance can be expressed by equation (7).

$$V_{OUT}=(D1+\Delta D)*(V_{IN}-I*R")-(1-D1-\Delta D)*I*R_{LS}-(I*R_{IND}) \quad (7)$$

By equating the right-hand sides of the equations (6) and (7) and ignoring the product of $\Delta D$ with any IR" term because they are very small, and by simplifying, equation (8) can be obtained:

$$1=V_{IN}*(\Delta D/D1)/(R"-R') \quad (8)$$

In equation (8), R"-R'=$\Delta$R. Thus, equation (8) can be rewritten as equation (9).

$$I=V_{IN}*(\Delta D/D1)/\Delta R \quad (9)$$

As can be seen above, equation (9) is the same as equation (5). Thus, in both the simplified analysis, which gives equation (5), and the detailed analysis, which gives equation (9), the value of current I can be calculated by control unit 210 based on the equation $I=V_{IN}*\Delta D/D1)/\Delta R$.

As described in more detail below, power controller 201 can be arranged such that the values of $V_{IN}$, $\Delta D$, D1, and $\Delta R$ (the right-hand side in equation (5) or (9)) can be available to control unit 210 to allow it to calculate the value of current I.

As shown in FIG. 2, control unit 210 can include a PWM generator 211 to generate signal PWM, a comparator (e.g., an analog-to-digital converter (ADC)) 212 to provide error code information ERR (which can be digital information), and a duty cycle compensator (e.g., a digital filter) 213 provide information $D_{DUTY}$ based on error code information ERR. Information $D_{DUTY}$ can be digital information and can be used to determine the value of the duty cycle of signal PWM. PWM generator 211 can adjust the duty cycle of signal PWM based on information $D_{DUTY}$.

Comparator 212 can provide error code information ERR based on a comparison between a value of a voltage (e.g., feedback voltage) $V_{FB}$ and a value of a voltage $V_{REF}$ (e.g., a reference voltage). Voltage $V_{FB}$ can be derived from voltage $V_{OUT}$, such that the value of voltage $V_{FB}$ can be based on the value of voltage $V_{OUT}$ and a ratio of a voltage divider formed by resistors R1 and R2. Voltage $V_{REF}$ can be provided by a reference generator 214, such that the value of voltage $V_{REF}$ can correspond to the value at which voltage $V_{OUT}$ is to be maintained (e.g., maintained at a predetermined value). Reference generator 214 may include a digital-to-analog converter (DAC) generator (not shown) to generate voltage $V_{REF}$ based on digital information.

Control unit 210 can include an input voltage monitor 218 to provide information $D_{VIN}$. Information $D_{VIN}$ can be digital information and can be used to determine the value of voltage $V_{IN}$ for the current calculation. Information $D_{VIN}$ can be based on a voltage $V_{SEN}$, which can be derived from voltage $V_{IN}$. The value of voltage $V_{SEN}$ can be based on the value of voltage $V_{IN}$ and a ratio of a voltage divider formed by resistors R3 and R4. Input voltage monitor 218 may include an ADC (e.g., delta-sigma ADC) 219 to provide information $D_{VIN}$ in the form of digital information (e.g., bits). Thus, information $D_{VIN}$ can contain information about the value (e.g., actual value) of voltage $V_{IN}$ in a digital domain. Information $D_{VIN}$ can be based on the average accumulated value for $V_{IN}$ over multiple cycles of signal PWM.

Control unit 210 can include a memory 17 to store the value of $\Delta R$ in digital form. The value of $\Delta R$ stored in memory 217 can be based on known values of the resistances (or known size ratio) of transistors M1 and M2. Memory 217 can be included in the firmware of power controller 201. Control unit 210 may also store the values of duty cycles (e.g., D1 and D2) in memory 217 and then determine the value of $\Delta D$ based on the stored values of duty cycles D1 and D2. For example, control unit 210 can perform a subtraction operation on the values of duty cycles D1 and D2 to obtain the value of $\Delta D$. FIG. 2 shows an example where memory 217 is part of (e.g., located at) control unit 210. In an alternative arrangement, a portion of memory 217 or the entire memory 217 can be part of (e.g., located at) output unit 220. In such an alternative arrangement, control unit 210 can obtain (e.g., read) information (e.g., the value of $\Delta R$) stored in memory 217 through a connection between control unit 210 and output unit 220. Such a connection can include a serial connection (e.g., an I²C serial interface).

Control unit 210 can include a current calculator 216 (which can include logic and circuit components) to calculate the value of current on output path 251 based on the equation $I=V_{IN}*(\Delta D/D1)/\Delta R$. As described above, the value of voltage $V_{IN}$ can be obtained based on information $D_{VIN}$. The values of $\Delta D$ and D1 can be obtained based on information $D_{DUTY}$. The value of $\Delta R$ can be obtained from memory 217. Since the values of $V_{IN}$, ($\Delta D/D1$), and $\Delta R$ can be obtained based on digital information, the value of current I on output path 251 can be digitally calculated (e.g., digitally sensed or digitally measured) by control unit 210 without external sensors (such as without external analog current sensors). Control unit 210 can provide the calculated value (resulting from the current calculation) as information $D_I$, which can be digital information representing the value of current I. Power controller 201 may use information $D_I$ as part of telemetry information collected by power controller 201 for use in other power management operations similar to those of power controller 101 described above.

As shown in FIG. 2, control unit 210 can include a command generator 261 to generate a command that can include signal $SEN_{EN}$. Control unit 210 can send such a command to output unit 220 through a connection between command generator 261 and output unit 220 when a current calculation operation is to be performed. Such a connection between command generator 261 and output unit 220 can include a serial connection (e.g., an I²C serial interface connection). For example, control unit 210 may send the command to output unit 220 by switching signal $SEN_{EN}$ from an initial level (e.g., low) to another level (e.g., high) to inform output unit 220 that a current calculation operation is to be performed. In response to signal $SEN_{EN}$, output unit 220 can turn off transistor M1 (or M2) to start the current calculation operation. After control unit 210 obtains the information (e.g., duty cycle D2) needed for the current calculation, it can switch signal $SEN_{EN}$ back to the initial level to inform output unit 220 to turn on transistor M1 (or M2) to return power controller 201 to its normal operation.

Output unit 220 can include a level shifter 221, drivers 222 and 223, and a driver controller 224 arranged as shown in FIG. 2 to control (e.g., turn on and off) transistors M1 and M2. For example, in a normal operation of power controller 201 (e.g., such as when no current calculation operation is to be performed), driver controller 224 can cause both transistors M1 and M2 to operate (e.g., turn on or off) in a normal fashion. However, when signal $SEN_{EN}$ switches from the initial level to another level indicating that a current calculation is to be performed, driver controller 224 can cause transistor M1 (or M2) turn off (e.g., turn off during multiple consecutive cycles of signal PWM). This causes a change in the resistance on conductive path 253 between nodes 241 and 242 to allow control unit 210 to obtain information needed for the current calculation, as described above. Driver controller 224 can cause transistor M1 (or M2) to turn on to return power controller 201 to its normal operation after the information for the current calculation is obtained, such as when signal $SEN_{EN}$ is switched back to the initial level.

As described above, the value ΔR can be stored in memory 217 based on known values of the resistance (e.g., on-state resistance) of each of transistors M1 and M2. For example, if the value of the resistance (when the transistor is turned on) of each of transistors M1 and M2 is X ohms (known value), then the resistance (R') on conductive path 253 between nodes 241 and 242 (before the change in resistance) is (½)X ohms (which is the value based on the parallel combination of transistors M1 and M2). When transistor M1 is turned off, the resistance (R") on conductive path 253 between nodes 241 and 242 (after the change in resistance) is X ohms (the resistance of transistor M2). Thus, in this example, ΔR=R"−R'=X−(½)X=(½)X ohms. This known value (e.g., (½)X ohms) can be stored in memory 217 (permanently stored or stored during a power-up sequence of power controller 201 before a current calculation operation is performed). During the current calculation operation, current calculator 216 can access memory 217 to obtain this stored value (e.g., (½)X) to calculate the value of current I. In the example here, transistors M1 and M2 are assumed to have the same resistance value (e.g., X ohms). Transistors and M2, however, can be structured (e.g., sized) to have different resistance values.

Transistors M1 and M2 can be large transistors (e.g., large FETs) to support load current in amperes, and may occupy a large die area. Thus, random variations in transistor resistance between transistors M1 and M2 can be minimal and can be matched. Therefore, such variations may have a low impact on the accuracy of the current calculation. Further, the value of ΔR can be kept simple by selecting the size of transistors M1 and M2 such that the ratio of transistor resistances of transistors M1 and M2 can be a fixed known ratio (e.g., ½, ¾ or other known ratios) based on an accuracy margin for voltage $V_{OUT}$.

FIG. 2 shows two transistors M1 and M2 between nodes 241 and 242 as an example. In an alternative arrangement, more than two transistors can be coupled (e.g., coupled in parallel) between nodes 241 and 242. In such an alternative arrangement, the value of ΔR (stored in memory 217) can be calculated in ways (e.g., ΔR=R"−R') similar to that described above for the arrangement that includes only two transistors (e.g., M1 and M2).

In the above description, the value of ΔR can be stored as a fixed, value (e.g., a single value of (½)X ohms). Alternatively, the value of ΔR can be calibrated for different skews of output unit 220. For example, output unit 220 may be included in an IC, such as a power-train IC (PTIC) In this example, the value of ΔR can be calibrated for different skews of the PTIC over a skew range at a particular temperature and stored in memory (e.g., memory 217) as a look-up table. The value of ΔR can also be calibrated at two temperatures using a known current load and measuring a voltage drop across nodes 241 and 242 (e.g., across transistors M1 and M2). Based on the value of ΔR at different temperatures, the slope of ΔR variation with temperature can be known and can be stored (e.g., stored in a register or in memory 217). This slope can be approximately linear based data across the temperature range and may be relatively accurate for some target applications. For certain low-accuracy applications where the current calculation is used, the temperature calibration mentioned above could either be limited to a small sample of PTIC's or can use the typical temperature slope for the current calculation. Alternatively, for a higher accuracy, the slope information versus skew can be stored (e.g., stored in memory 217). Control unit 210 can obtain (e.g., read) the stored skew information and temperature information and tune the value of ΔR to be used for the current calculation based on the operating temperature at the time of the current calculation.

Temperature information can be provided by a temperature sensor (not shown) of output unit 220. Alternatively, temperature information can be provided by a temperature sensor (not shown) of control unit 210. Based on temperature information, the value of ΔR can be adjusted dynamically if needed. Using the calibration (e.g., slope information versus skew information) described herein, the value of ΔR can be estimated with a relatively high accuracy (e.g., with an error of less than 4%). That may result in approximately less than or equal to 5% accuracy in the current calculation described herein.

As mention above, voltage $V_{IN}$ may be provided by a power source, such as a voltage $V_{BAT}$ from a battery. In the current calculation described herein, a variation (e.g., error) in voltage $V_{BAT}$ may be insignificant in the current calculation. For example, a 0.5% variation in voltage $V_{BAT}$ may reflect an approximately 0.5% variation (e.g., 0.5% error) in the current calculation because $V_{IN}$ is a multiplication term to ΔD. Moreover, resistors within 0.5% variation for the divider formed by resistors R3 and R4 can be commercial available. Therefore, a variation (e.g., 0.5% variation) in voltage $V_{BAT}$ can be negligible in the current calculation described herein relative to the accuracy target (e.g., 5% to 7%) of some applications.

The current calculation described herein can be more accurate in comparison with conventional techniques. For example, in some conventional techniques, 0.5% error in a voltage such as voltage $V_{IN}$ may result in a higher inaccuracy in the current calculation when such conventional techniques sense duty cycle D and voltages $V_{IN}$ and $V_{OUT}$ separately (e.g., from different sense paths) and then try to calculate an absolute value for $(D*V_{IN})-V_{OUT}$. The values for $D*V_{IN}$ and $V_{OUT}$ are much larger quantities compared with the difference between them. Also, if voltages $V_{IN}$ and $V_{OUT}$ are sensed from different sense paths, more sources of error can occur in the current calculation used by some conventional techniques. Further, in some conventional techniques, even a small percentage error in $V_{IN}$ and $V_{OUT}$ may result in a much larger error in the difference between $D*V_{IN}$ and $V_{OUT}$, thereby causing some conventional techniques to be less accurate in comparison with the current calculation technique described herein.

As shown in FIG. 2, power controller 201 can include IC dice 291 and 292. IC die 291 can include a voltage regulator controller IC die. IC die 292 can include driver-MOS IC (e.g., DrMOS IC) or PTIC.

FIG. 2 shows an example where some components of power controller 201, such as resistors R1, R2, R3, and R4, inductor L, and capacitor C, are located outside IC dice 291 and 292. In an alternative arrangement, some or all of these components (e.g., some or all of resistors R1, R2, R3, and R4, inductor L, and capacitor C) can be located on IC die 291, IC die 292, or both. For example, some or all of resistors R1, R2, R3, and R4 can be located on IC die 291. In another example, inductor L, capacitor C, or both can be located on IC die 292.

FIG. 2 shows an example where transistors M1, M2, and M3 are located on IC die 292. Alternatively, one or more of transistors M1, M2, and M3 can be located outside IC die 292 (e.g., located on a circuit board where power controller 201 is located).

FIG. 2 shows an example where power controller 201 includes multiple IC dice 291 and 292 where control unit 210 and output unit 220 are located in separate IC dice. In an alternative arrangement, power controller 201 can include a single IC die, such that control unit 210 and output unit 220 can be located on the same IC die. In the alternative arrangement, some of resistors R1, R2, R3, and R4, inductor L, and capacitor C can be located outside the single IC die (e.g., on a circuit board). Alternatively, all of resistors R1, R2, R3, and R4, inductor L, and capacitor C can be located on the same IC die with the rest of control unit 210 and output unit 220.

Some conventional techniques (e.g., resistor-based or inductor DC resistance (DCR) sensing) may involve multiple differential pins to bring differential voltage drop information back to the die. Then, a differential to single-ended amplifier with some gain, followed by a high-resolution analog-to-digital converter (ADC), is used to obtain load current information on the rail. Thus, the number of pins used for current sensing may prevent some conventional techniques from being used in some IC dice, may increase costs associated with current sensing, or both. Some other conventional techniques may involve a dummy transistor, additional complex analog circuitry (e.g., op-amp), and a high-resolution ADC. Such other conventional techniques may also increase costs of current sensing.

In comparison with some conventional techniques, determining the value of current I as described above may allow the IC die or IC dice (e.g., IC die 291, IC die 292, or both) where control unit 210, output unit 220, or both are located to have fewer external conductive contacts (e.g., fewer external pins on IC die 291, IC die 292, or both), a reduced cost, or both.

Figure 3:
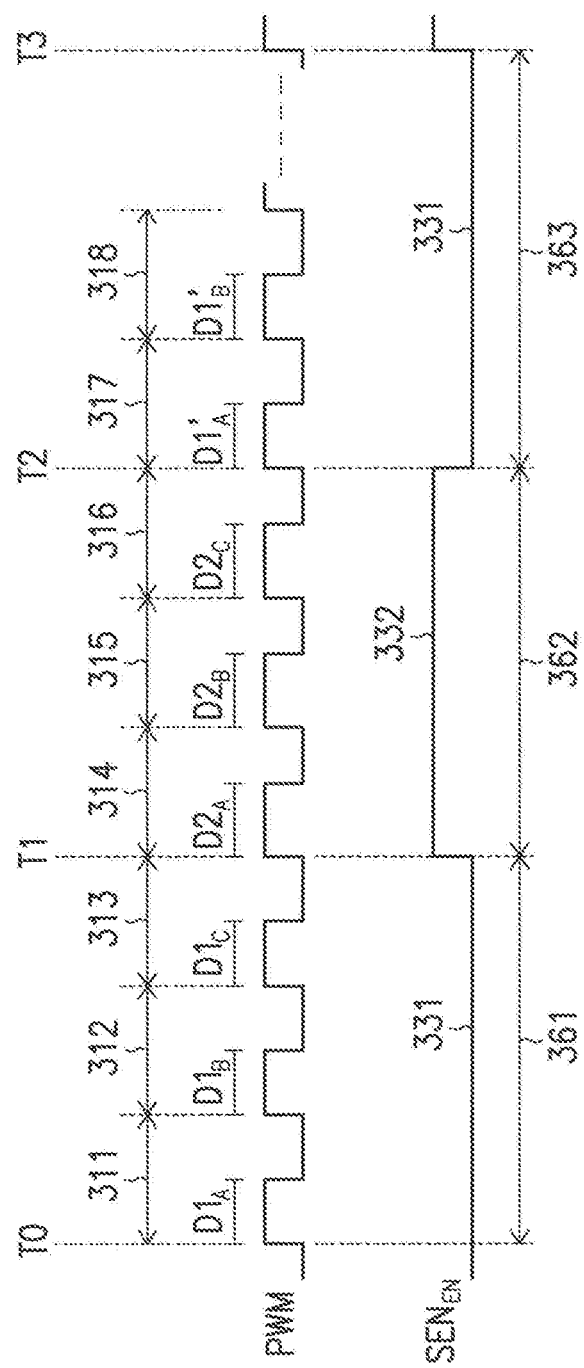
FIG. 3 is a timing diagram for some signals of the power controller of FIG. 2, according to some embodiments described herein.

FIG. 3 is a timing diagram for signals PWM and $SEN_{EN}$ of power controller 201 of FIG. 2, according to some embodiments described herein. FIG. 3 shows an example of signal PWM including eight cycles 311 through 318 and corresponding duty cycles $D1_A$, $D1_B$, $D1_C$, $D2_A$, $D2_B$, $D2_C$, $D1'_A$, and $D1'_B$. In the current calculation based on the equation $I=V_{IN}*(\Delta D/D1)\Delta R$ described above with reference to FIG. 2, the average of duty cycles $D1_A$, $D1_B$ and $D1_C$ in FIG. 3 can be selected to be the value for duty cycle D1. The average of duty cycles $D2_A$, $D2_B$, and $D2_C$ in FIG. 3 can be selected to be the value for duty cycle D2. Obtaining the average values of duty cycles D1 and D2 may avoid quantization error in the current calculation. The average of the duty cycles of three cycles of signal PWM is used here as an example. However, the average of the duty cycles of a different number of cycles (e.g., two or more than three) can be used. Further, the number of cycles of signal PWM used for the average of duty cycle D1 can be different from the number of cycles of signal PWM used for the average of duty cycle D2.

As shown in FIG. 3, signal $SEN_{EN}$ can include a level 331 that can occur during a time interval 361 (e.g., between times T0 and T1) and during a time interval 363 (e.g., between times T2 and T3). Signal $SEN_{EN}$ can also include a level 332 that can occur during a time interval 362 (e.g., between times T1 and T2). Time interval 361 can occur during multiple cycles (e.g., 311, 312, and 313) of signal PWM. Time interval 362 can occur during multiple cycles (e.g., 314, 315, and 316) of signal PWM. Time interval 363 can occur during multiple cycles (e.g., at least 317 and 318) of signal PWM.

Control unit 210 (FIG. 2) can perform the current calculation operation to calculate the value of current I (as described with reference to FIG. 2) during time interval 362. For example, output unit 220 can cause transistor M1 to turn off during time interval 362. During time intervals 361 and 363, output unit 220 can cause transistors M1 and M2 to operate (e.g., turn on or off) in normal fashion. Control unit 210 may repeat the current calculation operation at time T3. The power consumed by the current calculation operations can be proportional to the number of the current calculation operations. Thus, a lower number of the current calculation operations consumes less power than a higher number of the current calculation operations.

Figure 4:
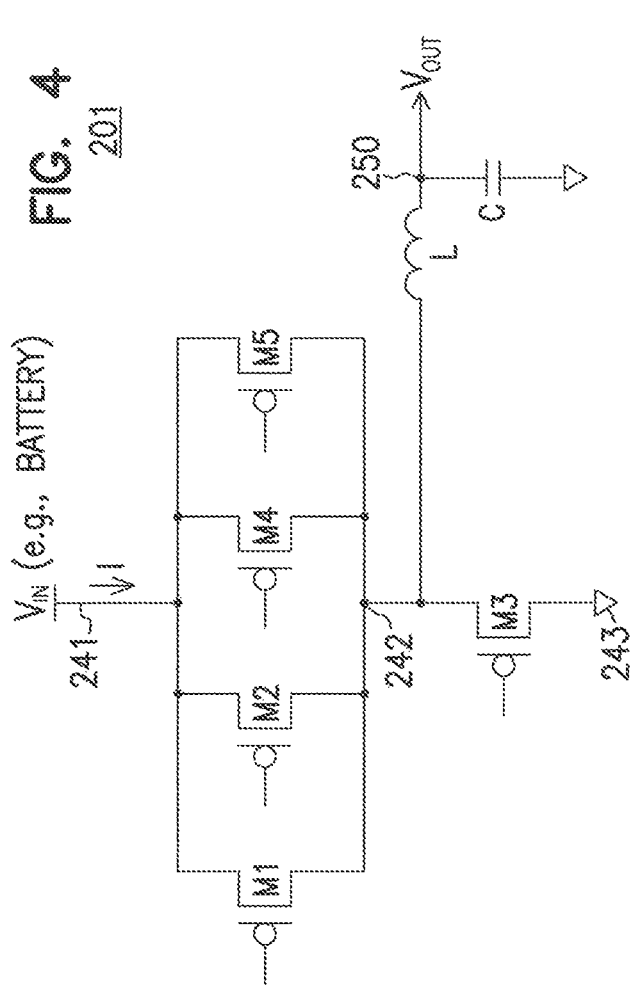
FIG. 4 shows an alternative structure of a portion of the power controller of FIG. 2, according to some embodiments described herein.

FIG. 4 shows an alternative structure of a portion of power controller 201 of FIG. 2, according to some embodiments described herein. As shown in FIG. 4, power controller 201 can also include transistors M4 and M5 coupled between nodes 241 and 242 in addition to transistors M1 and M2 (also shown in FIG. 2) that are also coupled between nodes 241 and 242. In the alternative structure shown in FIG. 4, driver controller 224 (FIG. 2) can cause at least one (e.g., one or more but fewer than all) of transistors M1, M2, M4, and M5 to turn off in order to change the resistance on the conductive path between nodes 241 and 242 for the current calculation operation. In FIG. 4, the value of $\Delta R$ can be predetermined and stored in memory 217 of power controller 201 in ways similar to those described above with reference to FIG. 2.

Figure 5:
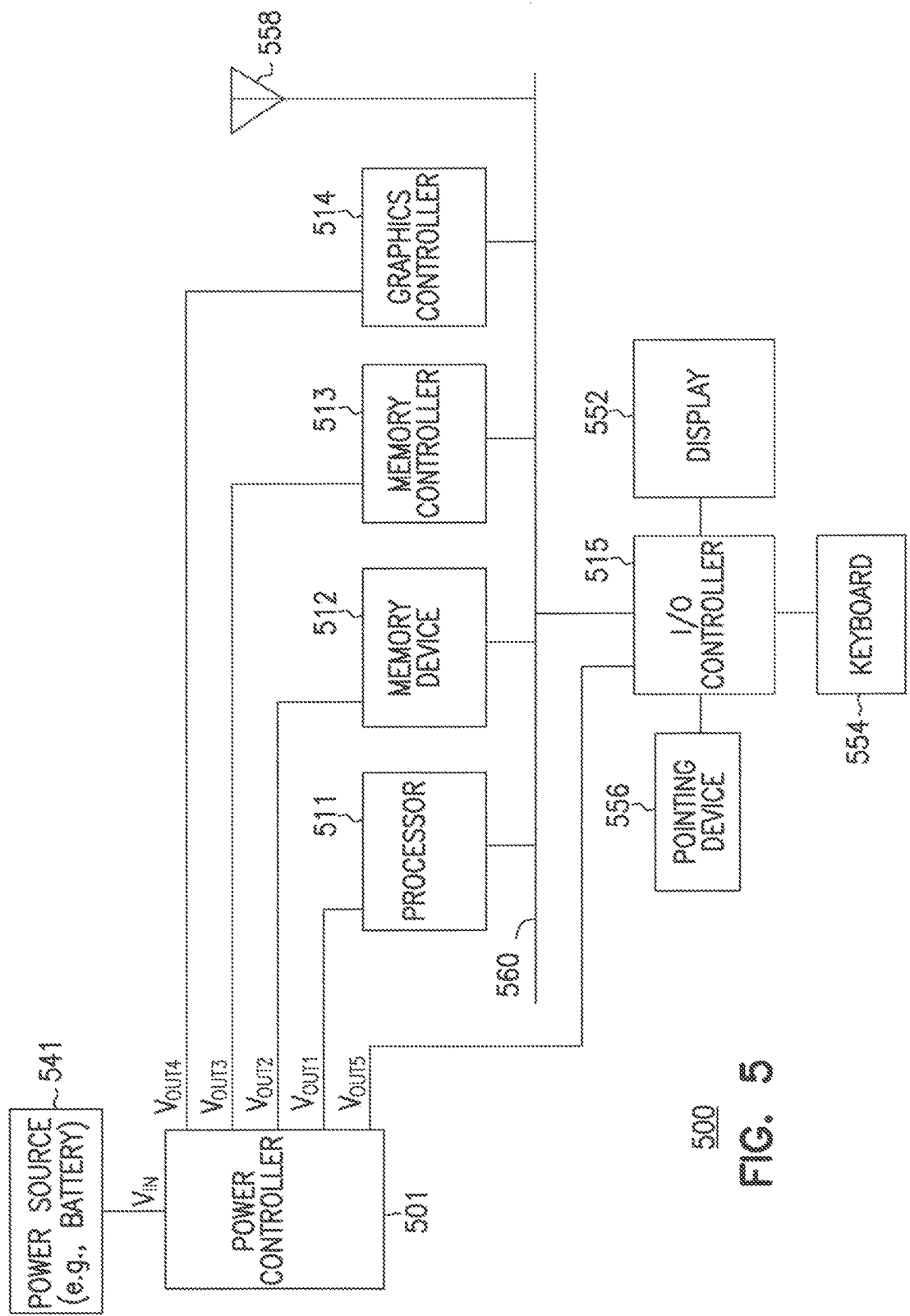
FIG. 5 shows an apparatus in the form of an electronic system including a power controller, according to some embodiments described herein.

FIG. 5 shows an apparatus in the form of a system (e.g., electronic system) 500, according to some embodiments described herein. System 500 can include or be included in a computer, a cellular phone, or other electronic systems. As shown in FIG. 5, system 500 can include a power controller 501, a processor 511, a memory device 512, a memory controller 513, a graphics controller 514, an input and output (I/O) controller 515, a display 552, a keyboard 554, a pointing device 556, at least one antenna 558, and a bus 560.

Each of processor 511, memory device 512, memory controller 513, graphics controller 514, and I/O controller 515 can include a functional unit, such as functional unit 130 (FIG. 1).

Processor 511 may include a general-purpose processor or an application specific integrated circuit (ASIC).

Memory device 512 may include a dynamic random access memory (DRAM) device, a static random access memory (SRAM) device, a flash memory device, or a combination of these memory devices. FIG. 5 shows an example where memory device 512 is a stand-alone memory device separated from processor 511. In an alternative arrangement, memory device 512 and processor 511 can be located on the same die. In such an alternative arrangement, memory device 512 is an embedded memory in processor 511, such as embedded DRAM (eDRAM), embedded SRAM (eSRAM), embedded flash memory, or another type of embedded memory.

Display 552 can include a liquid crystal display (LCD), a touchscreen (e.g., capacitive or resistive touchscreen), or another type of display. Pointing device 556 can include a mouse, a stylus, or another type of pointing device.

I/O controller 515 can include a communication module for wired or wireless communication e.g., communication through one or more antennas 558). Such wireless communication may include communication in accordance with WiFi communication technique, Long Term Evolution Advanced (LTE-A) communication technique, or other communication techniques.

Power controller 501 can be arranged to receive power (e.g., supply voltage) from a power source 541 that can provide a voltage $V_{IN}$, which can correspond to voltage $V_{IN}$ described above with reference to FIG. 1 through FIG. 4. Power controller 501 can provide voltages $V_{OUT1}$, $V_{OUT2}$, $V_{OUT3}$, $V_{OUT4}$, and $V_{OUT5}$ based on voltage $V_{IN}$. Voltages $V_{OUT1}$, $V_{OUT2}$, $V_{OUT3}$, $V_{OUT4}$, and $V_{OUT5}$ can be provided to processor 511, memory device 512, memory controller 513, graphics controller 514, and I/O controller 515, respectively. Power controller 501 can include power controller 101 (FIG. 1) or power controller 201 (FIG. 2), such that each of voltages $V_{OUT1}$, $V_{OUT2}$, $V_{OUT3}$, $V_{OUT4}$, and $V_{OUT5}$ can correspond to voltage $V_{OUT}$ of FIG. 1 or FIG. 2. Power controller 501 may include multiple output units (e.g., output unit 120 of FIG. 1 or output unit 220 of FIG. 2) to provide corresponding voltages $V_{OUT1}$, $V_{OUT2}$, $V_{OUT3}$, $V_{OUT4}$, and $V_{OUT5}$. Two or more of voltages $V_{OUT1}$, $V_{OUT2}$, $V_{OUT3}$, $V_{OUT4}$, and $V_{OUT5}$ can have different values. Alternatively, two or more of voltages $V_{OUT1}$, $V_{OUT2}$, $V_{OUT3}$, $V_{OUT1}$, and $V_{OUT5}$ can have the same value.

FIG. 5 shows an example where power controller 501 can be arranged in a single block. However, components of power controller 501 can be arranged in multiple blocks (e.g., multiple units) that can be distributed (e.g., scattered) in different locations of system 500. For example, in an arrangement, power controller 501 may include multiple output units (e.g., multiple PTICs) that can be located in different locations on a circuit board of system 500. In such an arrangement, platform current density in system 500 can be spreadout, which may provide an improvement (e.g., reduced current density on some locations of system 500) over some conventional power management techniques. Power controller 501 may provide other improvements in power management in system 500, such as improvements described above with reference to FIG. 1 through FIG. 4.

FIG. 5 shows the components of system 500 arranged separately from each other as an example. For example, each of processor 511, memory device 512, memory controller 513, graphics controller 514, and I/O controller 515 can be located on a separate die (e.g., a semiconductor die or an IC chip). In some arrangements, two or more components e.g., processor 511, memory device 512, graphics controller 514, and I/O controller 515) of system 500 can be located on the same die (e.g., same IC chip), forming a system-on-chip.

In some arrangements, system 500 does not have to include a display. Thus, display 552 can be omitted from system 500. In some arrangements, system 500 does not have to include an antenna. Thus, antenna 558 can be omitted from system 500.

Figure 6:
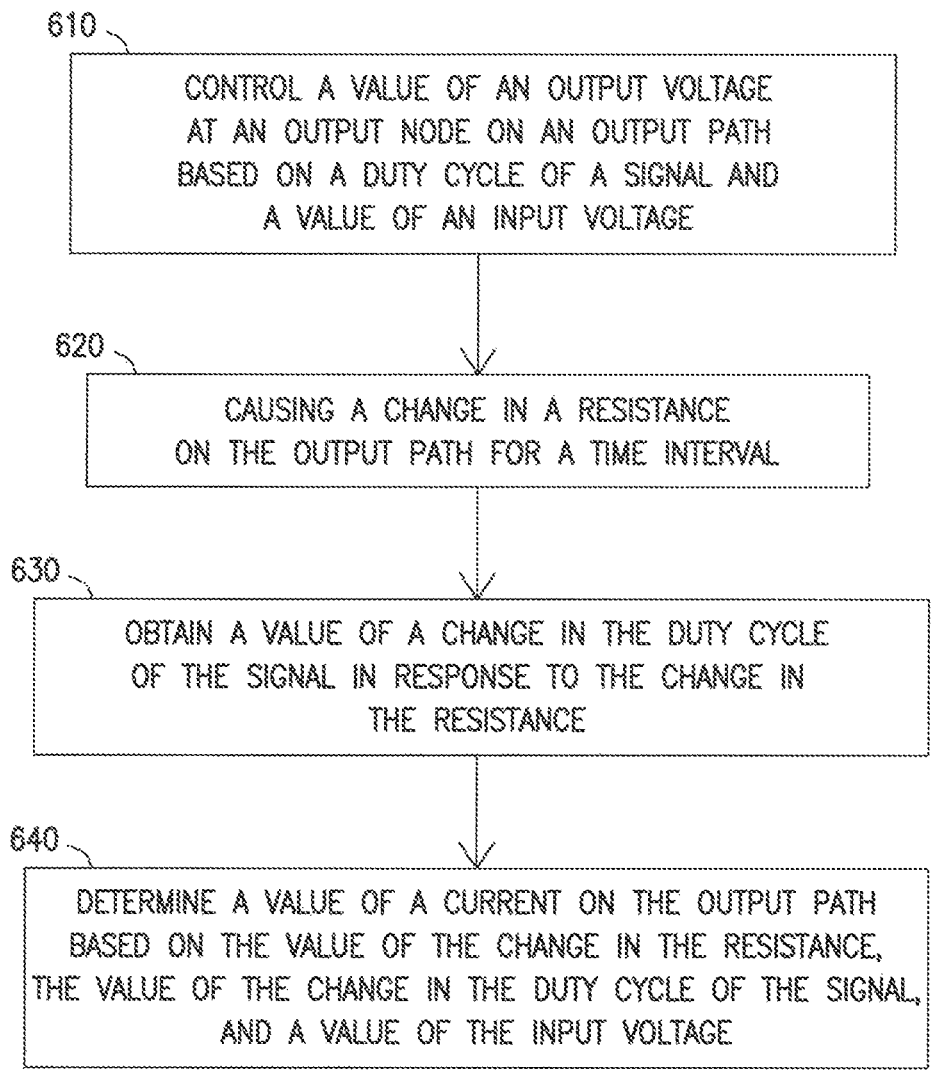
FIG. 6 is a flowchart showing a method of sensing current (e.g., calculating the value of current), according to some embodiments described herein.

FIG. 6 is a flowchart showing a method 600 of sensing current e.g., calculating the value of current), according to some embodiments described herein. Method 600 can be performed by a power controller, such as power controller 101, 201, or 501 described above with reference to FIG. 1 through FIG. 5.

As shown in FIG. 6, activity 610 of method 600 can include controlling a value of an output voltage (e.g., $V_{OUT}$) at an output node on an output path based on a duty cycle of a signal (e.g., signal PWM) and a value of an input voltage (e.g., $V_{IN}$). Activity 620 can include causing a change in a resistance on the output path for a time interval. Activity 630 can include obtaining a value of a change in the duty cycle of the signal in response to the change in the resistance. Activity 640 can include determining a value of a current (e.g., current I) on the output path based on the value (e.g., ΔR) of the change in the resistance, the value of the change in the duty cycle of the signal, and a value of the input voltage.

Method 600 can include fewer or more activities relative to activities 610, 620, 630, and 640 shown in FIG. 6, For example, method 600 can include activities and operations of power controller 101, 201, or 501 described above with reference to FIG. 1 through FIG. 5.

The illustrations of the apparatuses e.g., apparatus 100 including power controller 101, power controller 201, and system 500) and methods (e.g., method 600 and operations of power controller 101, power controller 201, and system 500) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

Additional Notes and Examples

Example 1 includes subject matter (such as a device, circuit apparatus or electronic sys-tem apparatus, or machine) a node to provide a signal; and a control unit arranged to control a value of an output voltage at an output node on an output path based on a duty cycle of the signal and a value of an input voltage, and to cause a change in a resistance on the output path in order to determine a value of a current on the output path based at least on the change in the resistance.

In Example 2, the subject matter of Example 1 may optionally include, wherein the control unit is arranged to cause a change in the duty cycle of the signal in response to the change in the resistance, and determine the value of the current based at least on the change in the duty cycle of the signal and the change in the resistance.

In Example 3, the subject matter of Example 1 may optionally include, wherein the control unit includes a current calculator to calculate the value of the current based on the value of the input voltage, a value of a change in the duty cycle of the signal in response to the change in the resistance, and a value of the change in the resistance.

In Example 4, the subject matter of Example 3 may optionally include, wherein the current calculator is arranged to obtain the value of the change in the resistance from a memory.

In Example 5, the subject matter of Example 1 may optionally include, wherein the control unit is arranged to cause the change in the resistance during a time interval of an operation of the apparatus, and the control unit is arranged to cause a transistor on the output path to turn off during the time interval in order to cause the change in the resistance.

In Example 6, the subject matter of Example 5 may optionally include an integrated circuit die, wherein the control unit is located on the integrated circuit die, and the transistor is located outside the integrated circuit die.

In Example 7, the subject matter of any one of Example 5 may optionally include, wherein the control unit includes a generator to generate the signal such that the time interval occurs during multiple cycles of the signal.

In Example 8, the subject matter of any one of Example 5 may optionally include a first node arranged to receive the input voltage, a second node included in the output path, and transistors coupled in parallel between the first and second nodes, wherein the transistor on the output path is among the transistors coupled in parallel between the first and second nodes.

In Example 9, the subject matter of Example 8 may optionally include, wherein the control unit is arranged to cause at least one additional transistor among the transistors coupled in parallel between the first and second nodes to turn off during the time interval.

Example 10 includes subject matter (such as a device, circuit apparatus or electronic system apparatus, or machine) including a node to receive a signal during an operation of the apparatus to control a value of an output voltage at an output path based on a duty cycle of the signal and a value of an input voltage at a first node coupled to the output path, transistors coupled in parallel between the first node and a second node on the output path, and a driver controller arranged to cause at least one of the transistors to turn off for a time interval during the operation in order to cause a change in the duty cycle of the signal.

In Example 11, the subject matter of Example 10 may optionally include a control unit to calculate a value of a current on the output path based on the input voltage, the change in the duty cycle, and a change in a resistance on at least part of the output path when the at least one transistor is turned off.

In Example 12, the subject matter of Example 11 may optionally include an integrated circuit die, wherein the driver controller is located on the integrated circuit die, and the control unit is located outside the integrated circuit die.

In Example 13, the subject matter of Example 12 may optionally include, wherein the transistors are located on the integrated circuit die.

In Example 14, the subject matter of Example 11 may optionally include a memory to store a value of the change in the resistance.

In Example 15, the subject matter of Example 14 may optionally include, wherein the memory is arranged to store temperature information associated with the value of the change in the resistance.

In Example 16, the subject matter of Example 15 may optionally include, wherein the memory is arranged to store slope information associated with the temperature information.

In Example 17, the subject matter of Example 10 may optionally include, wherein the driver controller is arranged to turn on the at least one transistor after the time interval in order to cause another change in the duty cycle of the signal.

In Example 18, the subject matter of Example 10 may optionally include, wherein the second node is arranged to couple to ground through a capacitor.

In Example 19, the subject matter of Example 18 may optionally include, wherein the second node is arranged to couple to ground through an inductor and through the capacitor.

Example 20 includes subject matter (such as a device, circuit apparatus or electronic system apparatus, or machine) including a processor, and a power controller coupled to the processor, the power controller including a first integrated circuit die including a node to receive a signal during an operation of the electronic system to control a value of an output voltage at an output path based on a duty cycle of the signal and a value of an input voltage at a first node coupled to the output path, and transistors coupled in parallel between the first node and a second node on the output path, and a second integrated circuit die including a node to provide the signal to the first integrated circuit die, and a control unit to cause at least one of the transistors to turn off for a time interval during the operation in order to cause a change in the duty cycle of the signal.

In Example 21, the subject matter of Example 17 may optionally include, wherein the power controller includes a current calculator arranged to determine a value of a current on the output path based on a change in a resistance on a conductive path between the first and second nodes, the change in the duty cycle of the signal, and the input voltage.

In Example 22, the subject matter of Example 17 may optionally include an antenna coupled to the processor.

In Example 23, the subject matter of Example 17 may optionally include a display coupled to the processor.

Example 24 includes subject matter including a method of sensing current, the method comprising controlling a value of an output voltage at an output node on an output path based on a duty cycle of a signal and a value of an input voltage, causing a change in a resistance on the output path for a time interval, obtaining a value of a change in the duty cycle of the signal in response to the change in the resistance, and determining a value of a current on the output path based on a value of the change in the resistance, the value of the change in the duty cycle of the signal, and the value of the input voltage.

In Example 25, the subject matter of Example 24 may optionally include, wherein determining the value of the current includes calculating the value of the current based on a formula $I=V_{IN}*[(D2-D1)/D1]/\Delta R$, where I represents the value of the current, \TIN represents the value of the input voltage, D2-D1 represents the value of the change in the duty cycle of the signal, D1 represents a value of the duty cycle of the signal before the change in the resistance, and ΔR represents the value of the change in the resistance.

The subject matter of Example 1 through Example 25 may combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 172(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a node to provide a signal; and
   a control unit to determine a value of a current on an output path based at least on a duty cycle of the signal and a value of an input voltage.

2. The apparatus of claim 1, wherein the control unit is to cause a change in a resistance on the output path in order to cause a change in the duty cycle of the signal.

3. The apparatus of claim 2, wherein the control unit is to cause the change in the resistance during a time interval of an operation of the apparatus, and the control unit includes a generator to generate the signal such that the time interval occurs during multiple cycles of the signal.

4. The apparatus of claim 3, further comprising an integrated circuit die, wherein the control unit is located on the integrated circuit die, and the transistor is located outside the integrated circuit die.

5. The apparatus of claim 3, further comprising a first node to receive the input voltage, a second node included in the output path, and transistors coupled in parallel between the first and second nodes, wherein the transistor on the output path is among the transistors coupled in parallel between the first and second nodes.

6. The apparatus of claim 5, wherein the control unit is to cause at least one additional transistor among the transistors coupled in parallel between the first and second nodes to switch between the first state and the second state during the time interval.

7. The apparatus of claim 2, wherein the control unit is to cause the change in the resistance during a time interval of an operation of the apparatus, and the control unit is to switch a transistor on the output path from a first state to a second state during the time interval in order to cause the change in the resistance.

8. The apparatus of claim 1, wherein the control unit includes a current calculator to calculate the value of the current based on the value of the input voltage, a value of a change in the duty cycle of the signal, and a value of the change in a resistance.

9. The apparatus of claim 8, wherein the control unit is included in an integrated circuit die, and the current calculator is to obtain the value of the change in the resistance from a memory included in the integrated circuit die.

10. An apparatus comprising:
    a node to receive a signal during an operation of the apparatus to control a value of an output voltage at an output path based on a duty cycle of the signal and a value of an input voltage at a first node coupled to the output path;
    transistors coupled in parallel between the first node and a second node on the output path; and
    a driver controller to cause at least one of the transistors to switch from a first state to a second state for a time interval during the operation in order to cause a change in the duty cycle of the signal.

11. The apparatus of claim 10, further comprising a control unit to calculate a value of a current on the output path based on the input voltage, the change in the duty cycle, and a change in a resistance on at least part of the output path.

12. The apparatus of claim 11, further comprising an integrated circuit die, wherein the driver controller is located on the integrated circuit die, and the control unit is located outside the integrated circuit die.

13. The apparatus of claim 12, wherein the transistors are located on the integrated circuit die.

14. The apparatus of claim 11, further comprising a memory to store a value of the change in the resistance.

15. The apparatus of claim 10, wherein the driver controller is to cause an additional transistor among the transistors to switch between the first state and the second state after the time interval in order to cause another change in the duty cycle of the signal.

16. The apparatus of claim 10, wherein the second node is to couple to ground through a capacitor.

17. The apparatus of claim 16, wherein the second node is to couple to ground through an inductor and through the capacitor.

18. An electronic system comprising:
    a processor; and
    a power controller coupled to the processor, the power controller including:
    a first integrated circuit die including a node to receive a signal during an operation of the electronic system to control a value of an output voltage at an output path based on a duty cycle of the signal and a value of an input voltage at a first node coupled to the output path, and transistors coupled in parallel between the first node and a second node on the output path; and
    a second integrated circuit die including a node to provide the signal to the first integrated circuit die, and a control unit to cause at least one of the transistors to switch from a first state to a second state for a time interval during the operation in order to cause a change in the duty cycle of the signal.

19. The electronic system of claim 18, wherein the power controller includes a current calculator to determine a value of a current on the output path based on a change in a resistance on a conductive path between the first and second nodes, the change in the duty cycle of the signal, and the input voltage.

20. The electronic system of claim 18, further comprising an antenna coupled to the processor.

* * * * *